United States Patent
Shiragami et al.

(10) Patent No.: US 11,871,676 B2
(45) Date of Patent: *Jan. 9, 2024

(54) AIRTIGHT PACKAGE INCLUDING A PACKAGE BASE AND A GLASS COVER HERMETICALLY SEALED WITH EACH OTHER VIA A SEALING MATERIAL LAYER

(71) Applicant: Nippon Electric Glass Co., Ltd., Shiga (JP)

(72) Inventors: Toru Shiragami, Shiga (JP); Hiroki Fujita, Shiga (JP)

(73) Assignee: NIPPON ELECTRIC GLASS CO., LTD., Shiga (JP)

( * ) Notice: Subject to any disclaimer, the term of this patent is extended or adjusted under 35 U.S.C. 154(b) by 862 days.

This patent is subject to a terminal disclaimer.

(21) Appl. No.: 16/482,764

(22) PCT Filed: Feb. 5, 2018

(86) PCT No.: PCT/JP2018/003753
§ 371 (c)(1),
(2) Date: Aug. 1, 2019

(87) PCT Pub. No.: WO2018/147210
PCT Pub. Date: Aug. 16, 2018

(65) Prior Publication Data
US 2019/0355893 A1   Nov. 21, 2019

(30) Foreign Application Priority Data
Feb. 7, 2017   (JP) .................. 2017-020004

(51) Int. Cl.
*H10N 30/88*   (2023.01)
*H01L 23/08*   (2006.01)
*H01L 23/10*   (2006.01)

(52) U.S. Cl.
CPC .............. *H10N 30/88* (2023.02); *H01L 23/08* (2013.01); *H01L 23/10* (2013.01); *H01L 2224/48091* (2013.01)

(58) Field of Classification Search
CPC ................................ H01L 23/08; H01L 23/10
See application file for complete search history.

(56) References Cited

U.S. PATENT DOCUMENTS 4,775,647 A * 10/1988 Smith, III ................. C03C 8/24
                                                           501/15
11,043,616 B2 * 6/2021 Shiragami ............... H01L 23/02
(Continued)

FOREIGN PATENT DOCUMENTS

JP       5-226493       9/1993
JP    2006-143585       6/2006
(Continued)

OTHER PUBLICATIONS

International Preliminary Report on Patentability and Written Opinion of the International Searching Authority dated Aug. 13, 2019 in International (PCT) Application No. PCT/JP2018/003753.
(Continued)

*Primary Examiner* — Laura M Menz
*Assistant Examiner* — Candice Chan
(74) *Attorney, Agent, or Firm* — Wenderoth, Lind & Ponack, L.L.P.

(57) ABSTRACT

A hermetic package of the present invention includes a package base and a glass cover hermetically sealed with each other via a sealing material layer, wherein the package base includes a base part and a frame part formed on the base part, wherein the package base has an internal device housed within the frame part, wherein the sealing material layer is arranged between a top of the frame part of the package base and the glass cover, and wherein an end portion of the
(Continued)

sealing material layer protrudes laterally in an arc shape in sectional view.

6 Claims, 3 Drawing Sheets

(56) References Cited

U.S. PATENT DOCUMENTS

| | | | | |
|---|---|---|---|---|
| 2012/0139133 A1* | 6/2012 | Takahashi | ............ | H01L 23/291 |
| | | | | 257/E23.117 |
| 2015/0380330 A1 | 12/2015 | Mitsui et al. | | |
| 2016/0120051 A1* | 4/2016 | Kamakura | ............ | H01B 3/004 |
| | | | | 220/660 |
| 2016/0236968 A1* | 8/2016 | Shiragami | ............ | B23K 26/18 |
| 2018/0033951 A1 | 2/2018 | Shiragami | | |
| 2019/0296194 A1* | 9/2019 | Shiragami | ............ | H01L 23/02 |

FOREIGN PATENT DOCUMENTS

| | | |
|---|---|---|
| JP | 2013-239609 | 11/2013 |
| JP | 2014-236202 | 12/2014 |
| JP | 2016-27610 | 2/2016 |
| WO | 2016/136899 | 9/2016 |

OTHER PUBLICATIONS

International Search Report dated Apr. 17, 2018 in International (PCT) Application No. PCT/JP2018/003753.
Notice of Reasons for Refusal dated Aug. 19, 2022 in corresponding Japanese Patent Application No. 2018-567411, with English-language translation.

* cited by examiner

AIRTIGHT PACKAGE INCLUDING A PACKAGE BASE AND A GLASS COVER HERMETICALLY SEALED WITH EACH OTHER VIA A SEALING MATERIAL LAYER

TECHNICAL FIELD

The present invention relates to a hermetic package, and more specifically, to a hermetic package including a package base and a glass cover hermetically sealed with each other via a sealing material layer.

BACKGROUND ART

A hermetic package generally includes a package base, a glass cover having light transmissivity, and an internal device to be housed inside thereof.

There is a risk in that the internal device to be mounted in the hermetic package, such as a deep ultraviolet LED device, deteriorates owing to moisture penetrating from a surrounding environment. An organic resin-based adhesive having low-temperature curability has hitherto been used for integrating the package base and the glass cover with each other. However, the organic resin-based adhesive cannot completely block moisture or a gas, and hence there is a risk in that the internal device deteriorates with time.

Meanwhile, when composite powder including glass powder and refractory filler powder is used as a sealing material, the sealed sites are less liable to deteriorate owing to moisture of a surrounding environment, and the hermetic reliability of the hermetic package is easily ensured.

However, the glass powder has a higher softening temperature than the organic resin-based adhesive, and hence there is a risk in that the internal device is thermally degraded at the time of sealing. Under such circumstances, laser sealing has attracted attention in recent years. According to the laser sealing, only a portion to be sealed can be locally heated, and hence the package base and the glass cover can be hermetically integrated with each other without thermal degradation of the internal device.

CITATION LIST

Patent Literature 1: JP 2013-239609 A
Patent Literature 2: JP 2014-236202 A

SUMMARY OF INVENTION

Technical Problem

Incidentally, when an excessive shear stress is applied to the hermetic package having been subjected to laser sealing, there is sometimes a problem in that bulk fracture occurs in the sealing material layer, and the hermetic reliability of the hermetic package cannot be ensured.

Thus, the present invention has been made in view of the above-mentioned circumstances, and a technical object of the present invention is to devise a hermetic package in which bulk fracture is less liable to occur in a sealing material layer even when a shear stress is applied to the sealing material layer.

Solution to Problem

The inventors of the present invention have found that the above-mentioned technical object can be achieved by causing an end portion of a sealing material layer to protrude in an arc shape. Thus, the finding is proposed as the present invention. That is, according to one embodiment of the present invention, there is provided a hermetic package, comprising a package base and a glass cover hermetically sealed with each other via a sealing material layer, wherein the package base comprises a base part and a frame part formed on the base part, wherein the package base has an internal device housed within the frame part, wherein the sealing material layer is arranged between a top of the frame part of the package base and the glass cover, and wherein an end portion of the sealing material layer protrudes laterally in an arc shape in sectional view. The "arc shape" as used herein is not limited to a complete arc shape, and means a convex shape which is rounded in its entirety with no corner.

In the hermetic package according to the embodiment of the present invention, the package base comprises the base part and the frame part formed on the base part, and the sealing material layer is arranged between the top of the frame part of the package base and the glass cover. With this, the internal device, such as a deep ultraviolet LED device, is easily housed within the frame part. Moreover, the internal device is less liable to deteriorate with time.

In addition, in the hermetic package according to the embodiment of the present invention, the end portion of the sealing material layer (an inner peripheral end portion and/or an outer peripheral end portion) protrudes laterally in an arc shape in sectional view. With this, when a shear stress is applied to the hermetic package, bulk fracture is less liable to occur in the sealing material layer. As a result, the hermetic reliability of the hermetic package can be improved. Herein, when the sealing material layer is preliminarily formed on the glass cover, and then the glass cover and the package base are laser sealed with each other under a state in which the sealing material layer is pressed from a glass cover side, the end portion of the sealing material layer easily protrudes in an arc shape. In addition, when glass ceramic, alumina, aluminum nitride, or the like is used as the package base, the sealing material layer exhibits appropriate wettability during laser sealing, and the end portion of the sealing material layer easily protrudes in an arc shape. The end portion of the sealing material layer generally has a meniscus shape (concave arc shape), or a shape in which a sealing width between the glass cover and the sealing material layer is larger than a sealing width (contact width) between the top of the frame part and the sealing material layer, that is, a shape which bulges from the top of the frame part toward the glass cover.

Secondly, in the hermetic package according to the embodiment of the present invention, it is preferred that a value obtained by dividing an average thickness of the sealing material layer by a maximum width of the sealing material layer be 0.003 or more. With this, even when a large shear stress is applied to the sealing material layer, bulk fracture is less liable to occur in the sealing material layer. The "maximum width of the sealing material layer" generally refers to a width of the sealing material layer corresponding to a portion which protrudes in an arc shape.

Thirdly, in the hermetic package according to the embodiment of the present invention, it is preferred that the sealing material layer be formed at a position distant from an inner peripheral end edge of the top of the frame part and distant from an outer peripheral end edge of the top of the frame part.

Fourthly, in the hermetic package according to the embodiment of the present invention, it is preferred that an average thickness of the sealing material layer be less than 8.0 μm and a maximum width of the sealing material layer be from 1 μm to 1,000 μm.

Fifthly, in the hermetic package according to the embodiment of the present invention, it is preferred that the sealing material layer comprise a sintered body of composite powder containing at least bismuth-based glass powder and refractory filler powder, and be substantially free of a laser absorber. As compared to glasses based on other materials, bismuth-based glass has a feature of easily forming a reaction layer in a surface layer of the package base (particularly, a ceramic base) at the time of laser sealing. In addition, the refractory filler powder can increase the mechanical strength of the sealing material layer, and can reduce the thermal expansion coefficient of the sealing material layer. Herein, the "bismuth-based glass" refers to glass comprising $Bi_2O_3$ as a main component, and specifically refers to glass comprising 25 mol % or more of $Bi_2O_3$ in a glass composition.

Sixthly, in the hermetic package according to the embodiment of the present invention, it is preferred that the package base comprise any one of glass, glass ceramic, aluminum nitride, and aluminum oxide, or a composite material thereof.

The present invention is described below with reference to the drawings. FIG. 1A is a schematic sectional view for illustrating an embodiment of the present invention, and FIG. 1B is an enlarged schematic sectional view of a main portion F of the embodiment of the present invention. As can be seen from FIG. 1A, a hermetic package 1 comprises a package base 10 and a glass cover 11. In addition, the package base 10 comprises a base part 12 and a frame part 13 in a frame shape on a peripheral end edge of the base part 12. Moreover, an internal device (e.g., deep ultraviolet LED device) 14 is housed within the frame part 13 of the package base 10. Electrical wiring (not shown) configured to electrically connect the internal device (e.g., deep ultraviolet LED device) 14 to an outside is formed in the package base 10.

A sealing material layer 15 is arranged between a top of the frame part 13 of the package base 10 and a surface of the glass cover 11 on an internal device 14 side over the entire periphery of the top of the frame part. In addition, the sealing material layer 15 comprises bismuth-based glass and refractory filler powder, and is substantially free of a laser absorber. Moreover, the width of the sealing material layer 15 is smaller than the width of the frame part 13 of the package base 10, and further, the sealing material layer 15 is distant from an end edge of the glass cover 11. Further, the average thickness of the sealing material layer 15 is less than 8.0 μm.

As apparent from FIG. 1B, an inner peripheral end portion 16 of the sealing material layer 15 protrudes in an arc shape, and an outer peripheral end portion 17 of the sealing material layer 15 protrudes in an arc shape. In other words, the sealing material layer 15 bulges in an X direction in sectional view. Moreover, a portion of the sealing material layer 15 which has a maximum width corresponds to a portion which protrudes in an arc shape (vertex of a bulged portion). That is, a width A of the sealing material layer 15 corresponding to the portion which protrudes in an arc shape is larger than a sealing width B (contact width) between the top of the frame part 13 and the sealing material layer 15, and is also larger than a sealing width C (contact width) between the glass cover 11 and the sealing material layer 15.

The sealing width B (contact width) between the top of the frame part 13 and the sealing material layer 15 is preferably larger than the sealing width C (contact width) between the glass cover 11 and the sealing material layer 15 from the viewpoint of accuracy of laser sealing. Meanwhile, the sealing width B (contact width) between the top of the frame part 13 and the sealing material layer 15 is preferably smaller than the sealing width C (contact width) between the glass cover 11 and the sealing material layer 15 from the viewpoint of sealing strength.

In addition, the above-mentioned hermetic package 1 may be produced as described below. First, the glass cover 11 on which the sealing material layer 15 has been formed in advance is placed on the package base 10 so that the sealing material layer 15 and the top of the frame part 13 are brought into contact with each other. Subsequently, while the glass cover 11 is pressed with a pressing jig, laser light L output from a laser irradiation apparatus 18 is radiated along the sealing material layer 15 from a glass cover 11 side. With this, the sealing material layer 15 softens and flows to react with a surface layer on the top of the frame part 13 of the package base 10, to thereby hermetically integrate the package base 10 and the glass cover 11 with each other. Thus, a hermetic structure of the hermetic package 1 is formed. In addition, the sealing material layer 15 is pressed from above during its softening and flowing, and thus the inner peripheral end portion 16 and the outer peripheral end portion 17 of the sealing material layer 15 each protrude in an arc shape. It is also appropriate to preliminarily form the sealing material layer 15 on the top of the frame part 13 of the package base 10 instead of preliminarily forming the sealing material layer 15 on the glass cover 11.

DESCRIPTION OF EMBODIMENTS

Figure 1A:
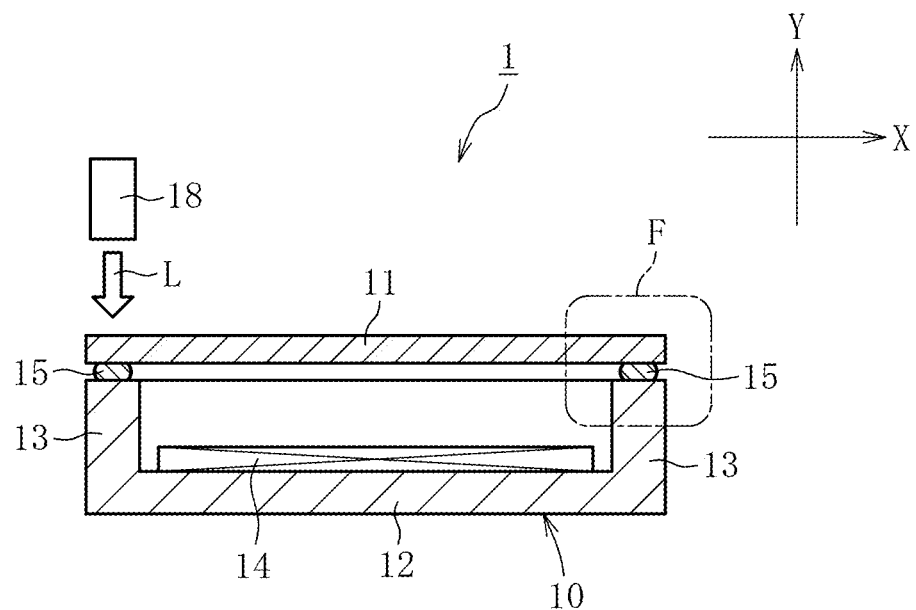
FIG. 1A is a schematic sectional view for illustrating an embodiment of the present invention.

As described above, a hermetic package of the present invention comprises a package base and a glass cover hermetically sealed with each other via a sealing material layer, wherein the package base comprises a base part and a frame part formed on the base part, wherein the package base has an internal device housed within the frame part, wherein the sealing material layer is arranged between a top of the frame part of the package base and the glass cover, and wherein an end portion of the sealing material layer protrudes laterally in an arc shape in sectional view. The hermetic package of the present invention is described in detail below.

In the hermetic package of the present invention, the package base comprises the base part and the frame part formed on the base part. With this, the internal device, such as a deep ultraviolet LED device, is easily housed within the frame part of the package base. The frame part of the package base is preferably formed in a frame shape along an outer peripheral end edge region of the package base. With this, an effective area for functioning as a device can be enlarged. In addition, the internal device, such as a deep ultraviolet LED device, is easily housed within the frame part of the package base. Besides, for example, joining of wiring is easily performed.

On the top of the frame part, a surface of a region in which the sealing material layer is to be formed preferably has a surface roughness Ra of less than 1.0 μm. When the surface roughness Ra on the surface is increased, the accuracy of laser sealing is liable to be reduced. Herein, the "surface roughness Ra" may be measured with, for example, a contact-type or non-contact-type laser film thickness meter or surface roughness meter.

The width of the top of the frame part is preferably from 100 μm to 3,000 μm or from 200 μm to 1,500 μm, particularly preferably from 300 μm to 900 μm. When the width of the top of the frame part is too small, it becomes difficult to align the sealing material layer and the top of the frame part. Meanwhile, when the width of the top of the frame part is too large, the effective area for functioning as a device is reduced.

The package base is preferably formed of any one of glass, glass ceramic, aluminum nitride, and aluminum oxide, or a composite material thereof (e.g., a composite material in which aluminum nitride and glass ceramic are integrated with each other). Glass easily forms a reaction layer with the sealing material layer, and hence high sealing strength can be ensured through the laser sealing. Glass ceramic has a feature of easily exhibiting appropriate wettability to the sealing material layer, and hence facilitating formation of a protrusion in an arc shape at the end portion of the sealing material layer. Further, glass ceramic facilitates formation of a thermal via, and hence a situation in which the temperature of the hermetic package is excessively increased can be properly prevented. Aluminum nitride and aluminum oxide each have a feature of easily exhibiting appropriate wettability to the sealing material layer, and hence facilitating formation of a protrusion in an arc shape at the end portion of the sealing material layer. Further, aluminum nitride and aluminum oxide each have a satisfactory heat dissipating property, and hence a situation in which the temperature of the hermetic package is excessively increased can be properly prevented.

It is preferred that glass ceramic, aluminum nitride, and aluminum oxide each have dispersed therein a black pigment (be each sintered under a state in which a black pigment is dispersed therein). With this, the package base can absorb laser light having transmitted through the sealing material layer. As a result, a portion of the package base to be brought into contact with the sealing material layer is heated during the laser sealing, and hence the formation of the reaction layer can be promoted at an interface between the sealing material layer and the package base.

The package base having dispersed therein the black pigment preferably has a property of absorbing laser light to be radiated, that is, has a total light transmittance at the wavelength (808 nm) of the laser light to be radiated of 10% or less (desirably 5% or less) when having a thickness of 0.5 mm. With this, the temperature of the sealing material layer is easily increased at an interface between the package base and the sealing material layer.

The thickness of the base part of the package base is preferably from 0.1 mm to 2.5 mm, particularly preferably from 0.2 mm to 1.5 mm. With this, thinning of the hermetic package can be achieved.

The height of the frame part of the package base, that is, a height obtained by subtracting the thickness of the base part from the package base is preferably from 100 μm to 2,000 μm, particularly preferably from 200 μm to 900 μm. With this, thinning of the hermetic package is easily achieved while the internal device is properly housed therein.

Various glasses may be used for the glass cover. For example, alkali-free glass, alkali borosilicate glass, or soda lime glass may be used. The glass cover may be laminated glass obtained by bonding a plurality of glass sheets.

A functional film may be formed on a surface of the glass cover on an internal device side, or on a surface of the glass cover on an outside. An antireflection film is particularly preferred as the functional film. With this, light reflected on the surface of the glass cover can be reduced.

The thickness of the glass cover is preferably 0.1 mm or more, from 0.2 mm to 2.0 mm, or from 0.4 mm to 1.5 mm, particularly preferably from 0.5 mm to 1.2 mm. When the thickness of the glass cover is small, the strength of the hermetic package is liable to be reduced. Meanwhile, when the thickness of the glass cover is large, it becomes difficult to achieve thinning of the hermetic package.

A difference in thermal expansion coefficient between the glass cover and the sealing material layer is preferably less than $50 \times 10^{-7}/°C$ or less than $40 \times 10^{-7}/°C$, particularly preferably $30 \times 10^{-7}/°C$ or less. When the difference in thermal expansion coefficient is too large, a stress remaining in the sealed sites is improperly increased, and the hermetic reliability of the hermetic package is liable to be reduced.

The sealing material layer has a function of softening and deforming by absorbing laser light to form a reaction layer in a surface layer of the package base, to thereby hermetically integrate the package base and the glass cover with each other.

The end portion of the sealing material layer (an inner peripheral end portion and/or an outer peripheral end portion) protrudes laterally in an arc shape in sectional view. It is preferred that the inner peripheral end portion and the outer peripheral end portion of the sealing material layer protrude in an arc shape. With this, when a shear stress is applied to the hermetic package, bulk fracture is less liable to occur in the sealing material layer. As a result, the hermetic reliability of the hermetic package can be improved.

Figure 1B:
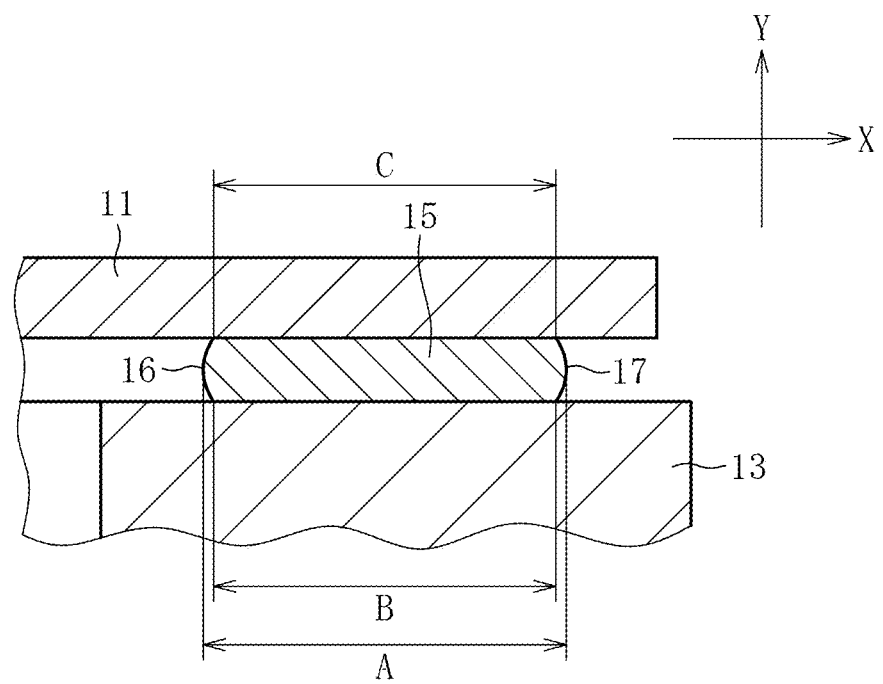
FIG. 1B is an enlarged schematic sectional view of a main portion of the embodiment of the present invention.

A maximum protrusion width of the sealing material layer (the total of a maximum bulge width at the inner peripheral end portion and a maximum bulge width at the outer peripheral end portion) is larger than an average sealing width (average contact width) between the top of the frame part and the sealing material layer by preferably 0.2 μm or more (A-B in FIG. 1B), particularly preferably 0.5 μm or more. The maximum protrusion width (the total of the maximum bulge width at the inner peripheral end portion and the maximum bulge width at the outer peripheral end portion) is larger than an average sealing width (average contact width) between the glass cover and the sealing material layer by preferably 0.2 μm or more (A-C in FIG. 1B), particularly preferably 0.5 μm or more. With this, when a shear stress is applied to the hermetic package, bulk fracture is less liable to occur in the sealing material layer. As a result, the hermetic reliability of the hermetic package can be properly improved.

The maximum protrusion width at the inner peripheral end portion of the sealing material layer (the maximum bulge width at the inner peripheral end portion) is larger than the average sealing width (average contact width) between the top of the frame part and the sealing material layer by preferably 0.1 μm or more or 0.3 μm or more, particularly preferably 0.5 μm or more. The maximum protrusion width at the inner peripheral end portion (the maximum bulge width at the inner peripheral end portion) is larger than the average sealing width (average contact width) between the glass cover and the sealing material layer by preferably 0.1 μm or more or 0.3 μm or more, particularly preferably 0.5 μm or more. With this, when a shear stress is applied to an inside of the hermetic package, bulk fracture is less liable to occur in the sealing material layer. As a result, the hermetic reliability of the hermetic package can be properly improved.

The maximum protrusion width at the outer peripheral end portion of the sealing material layer (the maximum bulge width at the outer peripheral end portion) is larger than the average sealing width (average contact width) between the top of the frame part and the sealing material layer by preferably 0.1 μm or more or 0.3 μm or more, particularly preferably 0.5 μm or more. The maximum protrusion width at the outer peripheral end portion (the maximum bulge width at the outer peripheral end portion) is larger than the average sealing width (average contact width) between the glass cover and the sealing material layer by preferably 0.1 μm or more or 0.3 μm or more, particularly preferably 0.5 μm or more. With this, when a shear stress is applied to an outside of the hermetic package, bulk fracture is less liable to occur in the sealing material layer. As a result, the hermetic reliability of the hermetic package can be properly improved.

The sealing material layer is preferably formed so that its contact position with the frame part is distant from the inner peripheral end edge of the top of the frame part and distant from the outer peripheral end edge of the top of the frame part. The sealing material layer is more preferably formed at a position distant from the inner peripheral end edge of the top of the frame part by 50 μm or more, 60 μm or more, or from 70 μm to 2,000 μm, particularly from 80 μm to 1,000 μm. When a distance between the inner peripheral end edge of the top of the frame part and the sealing material layer is too short, it becomes difficult to release heat generated through local heating during the laser sealing, and hence the glass cover is liable to be broken in the course of cooling. Meanwhile, when the distance between the inner peripheral end edge of the top of the frame part and the sealing material layer is too long, it becomes difficult to achieve downsizing of the hermetic package. In addition, the sealing material layer is preferably formed at a position distant from the outer peripheral end edge of the top of the frame part by 50 μm or more, 60 μm or more, or from 70 μm to 2,000 μm, particularly from 80 μm to 1,000 μm. When a distance between the outer peripheral end edge of the top of the frame part and the sealing material layer is too short, it becomes difficult to release heat generated through local heating during the laser sealing, and hence the glass cover is liable to be broken in the course of cooling. Meanwhile, when the distance between the outer peripheral end edge of the top of the frame part and the sealing material layer is too long, it becomes difficult to achieve downsizing of the hermetic package.

The sealing material layer is preferably formed so that its contact position with the glass cover is distant from an end edge of the glass cover by 50 μm or more, 60 μm or more, or from 70 μm to 1, 500 μm, particularly from 80 μm to 800 μm. When a distance between the end edge of the glass cover and the sealing material layer is too short, a difference in surface temperature between the surface of the glass cover on the internal device side and the surface of the glass cover on the outside is increased in an end edge region of the glass cover at the time of laser sealing, and the glass cover is liable to be broken.

The sealing material layer is preferably formed on a center line of the top of the frame part in a width direction, that is, in a middle region of the top of the frame part. With this, heat generated through local heating during the laser sealing is easily released, and hence the glass cover is less liable to be broken. When the top of the frame part has a sufficiently large width, the sealing material layer does not need to be formed on the center line of the top of the frame part in the width direction.

The average thickness of the sealing material layer is preferably less than 8.0 μm, particularly preferably 1.0 μm or more and less than 6.0 μm. As the average thickness of the sealing material layer is reduced more, a stress remaining in the sealed sites after the laser sealing can be reduced more when the thermal expansion coefficient of the sealing material layer and the thermal expansion coefficient of the glass cover do not match each other. In addition, also the accuracy of the laser sealing can be improved more. As a method of controlling the average thickness of the sealing material layer as described above, the following methods are given: a method involving thinly applying a composite powder paste; and a method involving subjecting the surface of the sealing material layer to polishing treatment.

The maximum width of the sealing material layer is preferably 1 μm or more and 2,000 μm or less, 10 μm or more and 1,000 μm or less, or 50 μm or more and 800 μm or less, particularly preferably 100 μm or more and 600 μm or less. When the maximum width of the sealing material layer is small, the sealing material layer is easily distant from the end edges of the frame part, and hence a stress remaining in the sealed sites after the laser sealing is easily reduced. Further, the width of the frame part of the package base can be reduced, and thus the effective area for functioning as a device can be enlarged. Meanwhile, when the maximum width of the sealing material layer is too small, bulk fracture is liable to occur in the sealing material layer in the case where a large shear stress is applied to the sealing material layer. Further, the accuracy of laser sealing is liable to be reduced.

A value obtained by dividing the average thickness of the sealing material layer by the maximum width of the sealing material layer is preferably 0.003 or more, 0.005 or more, or from 0.01 to 0.1, particularly preferably from 0.02 to 0.05. When the value obtained by dividing the average thickness of the sealing material layer by the maximum width of the sealing material layer is too small, bulk fracture is liable to occur in the sealing material layer in the case where a large shear stress is applied to the sealing material layer. Meanwhile, when the value obtained by dividing the average thickness of the sealing material layer by the maximum width of the sealing material layer is too large, the accuracy of laser sealing is liable to be reduced.

The surface roughness Ra of the sealing material layer is preferably less than 0.5 μm or 0.2 μm or less, particularly preferably from 0.01 μm to 0.15 μm. In addition, the surface roughness RMS of the sealing material layer is preferably less than 1.0 μm or 0.5 μm or less, particularly preferably from 0.05 μm to 0.3 μm. With this, the adhesiveness between the package base and the sealing material layer is increased, and the accuracy of the laser sealing is improved. Herein, the "surface roughness RMS" may be measured with, for example, a contact-type or non-contact-type laser film thickness meter or surface roughness meter. As a method of controlling the surface roughnesses Ra and RMS of the sealing material layer as described above, the following methods are given: a method involving subjecting the surface of the sealing material layer to polishing treatment; and a method involving reducing the particle size of refractory filler powder.

The sealing material layer preferably comprises a sintered body of composite powder containing at least glass powder and refractory filler powder. The glass powder is a component which absorbs laser light during the laser sealing to soften and deform, to thereby hermetically integrate the package base and the glass cover with each other. The refractory filler powder is a component which acts as a framework material, and increases the mechanical strength of the sealing material layer while reducing the thermal expansion coefficient of the sealing material layer. The sealing material layer may comprise a laser absorber in order to improve light absorption characteristics in addition to the glass powder and the refractory filler powder.

Various materials may be used as the composite powder. Of those, composite powder containing bismuth-based glass powder and refractory filler powder is preferably used from the viewpoint of increasing sealing strength. As the composite powder, it is preferred to use composite powder containing 55 vol % to 95 vol % of bismuth-based glass powder and 5 vol % to 45 vol % of refractory filler powder. It is more preferred to use composite powder containing 60 vol % to 85 vol % of bismuth-based glass powder and 15 vol % to 40 vol % of refractory filler powder. It is particularly preferred to use composite powder containing 60 vol % to 80 vol % of bismuth-based glass powder and 20 vol % to 40 vol % of refractory filler powder. When the refractory filler powder is added, the thermal expansion coefficient of the sealing material layer easily matches the thermal expansion coefficients of the glass cover and the package base. As a result, a situation in which an improper stress remains in the sealed sites after the laser sealing is easily prevented. Meanwhile, when the content of the refractory filler powder is too large, the content of the glass powder is relatively reduced. Thus, the surface smoothness of the sealing material layer is reduced, and the accuracy of the laser sealing is liable to be reduced.

Figure 2:
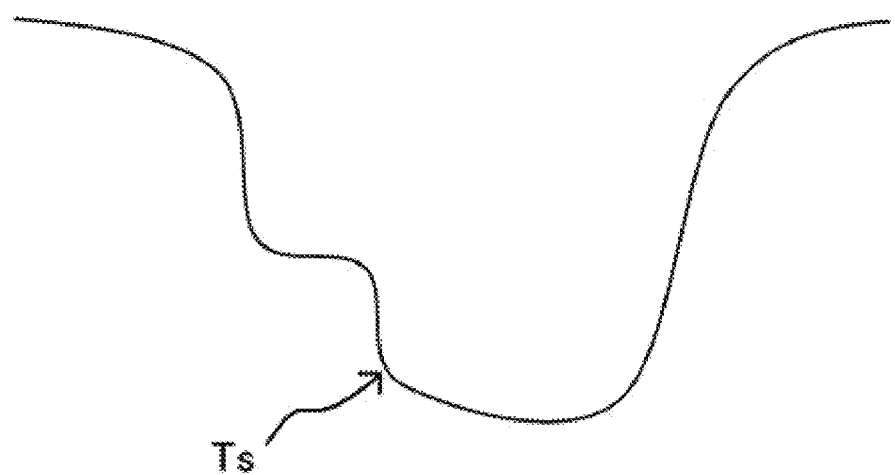
FIG. 2 is a schematic view for illustrating a softening point of composite powder measured with a macro-type DTA apparatus.

The softening point of the composite powder is preferably 510° C. or less or 480° C. or less, particularly preferably 450° C. or less. When the softening point of the composite powder is too high, it becomes difficult to increase the surface smoothness of the sealing material layer. The lower limit of the softening point of the composite powder is not particularly set, but in consideration of the thermal stability of the glass powder, the softening point of the composite powder is preferably 350° C. or more. Herein, the "softening point" refers to the fourth inflection point measured with a macro-type DTA apparatus, and corresponds to Ts in FIG. 2.

The bismuth-based glass preferably comprises as a glass composition, in terms of mol %, 28% to 60% of $Bi_2O_3$, 15% to 37% of $B_2O_3$, and 1% to 30% of ZnO. The reasons why the content range of each component is limited as described above are described below. In the description of the glass composition range, the expression "%" means "mol %".

$Bi_2O_3$ is a main component for reducing a softening point. The content of $Bi_2O_3$ is preferably from 28% to 60% or from 33% to 55%, particularly preferably from 35% to 45%. When the content of $Bi_2O_3$ is too small, the softening point becomes too high, and softening flowability is liable to be reduced. Meanwhile, when the content of $Bi_2O_3$ is too large, the glass is liable to devitrify at the time of laser sealing, and owing to the devitrification, the softening flowability is liable to be reduced.

$B_2O_3$ is an essential component as a glass-forming component. The content of $B_2O_3$ is preferably from 15% to 37% or from 19% to 33%, particularly preferably from 22% to 30%. When the content of $B_2O_3$ is too small, a glass network is hardly formed, and hence the glass is liable to devitrify at the time of laser sealing. Meanwhile, when the content of $B_2O_3$ is too large, the glass has increased viscosity, and hence the softening flowability is liable to be reduced.

ZnO is a component which improves devitrification resistance. The content of ZnO is preferably from 1% to 30%, from 3% to 25%, or from 5% to 22%, particularly preferably from 5% to 20%. When the content of ZnO is outside the above-mentioned range, the glass composition loses its component balance, and hence the devitrification resistance is liable to be reduced contrarily.

In addition to the above-mentioned components, for example, the following components may be added.

$SiO_2$ is a component which improves water resistance. The content of $SiO_2$ is preferably from 0% to 5%, from 0% to 3%, or from 0% to 2%, particularly preferably from 0% to 1%. When the content of $SiO_2$ is too large, there is a risk in that the softening point is improperly increased. In addition, the glass is liable to devitrify at the time of laser sealing.

$Al_2O_3$ is a component which improves the water resistance. The content of $Al_2O_3$ is preferably from 0% to 10% or from 0.1% to 5%, particularly preferably from 0.5% to 3%. When the content of $Al_2O_3$ is too large, there is a risk in that the softening point is improperly increased.

$Li_2O$, $Na_2O$, and $K_2O$ are each a component which reduces the devitrification resistance. Therefore, the content of each of $Li_2O$, $Na_2O$, and $K_2O$ is preferably from 0% to 5% or from 0% to 3%, particularly preferably from 0% to less than 1%.

MgO, CaO, SrO, and BaO are each a component which improves the devitrification resistance, but are each a component which increases the softening point. Therefore, the content of each of MgO, CaO, SrO, and BaO is preferably from 0% to 20% or from 0% to 10%, particularly preferably from 0% to 5%.

In order to reduce the softening point of bismuth-based glass, it is required to introduce a large amount of $Bi_2O_3$ into the glass composition, but when the content of $Bi_2O_3$ is increased, the glass is liable to devitrify at the time of laser sealing, and owing to the devitrification, the softening flowability is liable to be reduced. This tendency is particularly remarkable when the content of $Bi_2O_3$ is 30% or more. As a countermeasure for this problem, the addition of CuO can effectively suppress a reduction in devitrification resistance even when the content of $Bi_2O_3$ is 30% or more. Further, when CuO is added, laser absorption characteristics at the time of laser sealing can be improved. The content of CuO is preferably from 0% to 40%, from 1% to 40%, from 5% to 35%, or from 10% to 30%, particularly preferably from 13% to 25%. When the content of CuO is too large, the glass composition loses its component balance, and hence the devitrification resistance is liable to be reduced contrarily. In addition, the total light transmittance of the sealing material layer is excessively reduced, and it becomes difficult to locally heat a boundary region between the package base and the sealing material layer.

$Fe_2O_3$ is a component which improves the devitrification resistance and the laser absorption characteristics. The content of $Fe_2O_3$ is preferably from 0% to 10% or from 0.1% to 5%, particularly preferably from 0.4% to 2%. When the content of $Fe_2O_3$ is too large, the glass composition loses its component balance, and hence the devitrification resistance is liable to be reduced contrarily.

MnO is a component which improves the laser absorption characteristics. The content of MnO is preferably from 0% to 25%, particularly preferably from 5% to 15%. When the content of MnO is too large, the devitrification resistance is liable to be reduced.

$Sb_2O_3$ is a component which improves the devitrification resistance. The content of $Sb_2O_3$ is preferably from 0% to 5%, particularly preferably from 0% to 2%. When the content of $Sb_2O_3$ is too large, the glass composition loses its component balance, and hence the devitrification resistance is liable to be reduced contrarily.

The average particle diameter $D_{50}$ of the glass powder is preferably less than 15 μm or from 0.5 μm to 10 μm, particularly preferably from 1 μm to 5 μm. As the average particle diameter $D_{50}$ of the glass powder becomes smaller, the softening point of the glass powder is reduced more. Herein, the "average particle diameter $D_{50}$" refers to a value measured by laser diffractometry on a volume basis.

The refractory filler powder is preferably one kind or two or more kinds selected from cordierite, zircon, tin oxide, niobium oxide, zirconium phosphate-based ceramic, willemite, β-eucryptite, and β-quartz solid solution, particularly preferably β-eucryptite or cordierite. Those refractory filler powders each have a low thermal expansion coefficient and a high mechanical strength, and besides are each well compatible with the bismuth-based glass.

The average particle diameter $D_{50}$ of the refractory filler powder is preferably less than 2 μm, particularly preferably 0.1 μm or more and less than 1.5 μm. When the average particle diameter $D_{50}$ of the refractory filler powder is too large, the surface smoothness of the sealing material layer is liable to be reduced. Besides, the average thickness of the sealing material layer is liable to be increased, with the result that the accuracy of the laser sealing is liable to be reduced.

The 99% particle diameter $D_{99}$ of the refractory filler powder is preferably less than 5 μm or 4 μm or less, particularly preferably 0.3 μm or more and 3 μm or less. When the 99% particle diameter $D_{99}$ of the refractory filler powder is too large, the surface smoothness of the sealing material layer is liable to be reduced. Besides, the average thickness of the sealing material layer is liable to be increased, with the result that the accuracy of the laser sealing is liable to be reduced. Herein, the "99% particle diameter $D_{99}$" refers to a value measured by laser diffractometry on a volume basis.

The sealing material layer may further comprise a laser absorber in order to improve light absorption characteristics. However, the laser absorber has an action of accelerating the devitrification of the bismuth-based glass, and hence, the content of the laser absorber in the sealing material layer is preferably 10 vol % or less, 5 vol % or less, 1 vol % or less, or 0.5 vol % or less. It is particularly preferred that the sealing material layer be substantially free of the laser absorber (0.1 vol % or less). When the bismuth-based glass has satisfactory devitrification resistance, the laser absorber may be introduced at 1 vol % or more, particularly 3 vol % or more in order to improve laser absorption characteristics. As the laser absorber, for example, a Cu-based oxide, an Fe-based oxide, a Cr-based oxide, a Mn-based oxide, or a spinel-type composite oxide thereof may be used.

The thermal expansion coefficient of the sealing material layer is preferably from $55\times10^{-7}$/° C. to $95\times10^{-7}$/° C. or from $60\times10^{-7}$/° C. to $82\times10^{-7}$/° C., particularly preferably from $65\times10^{-7}$/° C. to $76\times10^{-7}$/° C. With this, the thermal expansion coefficient of the sealing material layer matches the thermal expansion coefficient of the glass cover or the thermal expansion coefficient of the package base, with the result that bulk fracture due to a shear stress is less liable to occur in the sealing material layer. The "thermal expansion coefficient" refers to a value measured with a push-rod type thermal expansion coefficient measurement (TMA) apparatus in a temperature range of from 30° C. to 300° C.

The sealing material layer may be formed by various methods. Of those, the sealing material layer is preferably formed by a method involving applying and sintering a composite powder paste. Moreover, the application of the composite powder paste is preferably performed with a coating machine, such as a dispenser or a screen printing machine. With this, the dimensional accuracy of the sealing material layer (the dimensional accuracy of the sealing material layer in terms of width) can be improved. In this case, the composite powder paste is a mixture of the composite powder and a vehicle. In addition, the vehicle generally contains a solvent and a resin. The resin is added for the purpose of adjusting the viscosity of the paste. In addition, a surfactant, a thickener, or the like may also be added thereto as required.

The composite powder paste is generally produced by kneading the composite powder and the vehicle with a triple roller or the like. The vehicle generally contains a resin and a solvent. As the resin to be used in the vehicle, there may be used an acrylic acid ester (acrylic resin), ethylcellulose, a polyethylene glycol derivative, nitrocellulose, polymethylstyrene, polyethylene carbonate, polypropylene carbonate, a methacrylic acid ester, and the like. As the solvent to be used in the vehicle, there may be used N,N'-dimethyl formamide (DMF), α-terpineol, a higher alcohol, γ-butyrolactone (γ-BL), tetralin, butylcarbitol acetate, ethyl acetate, isoamyl acetate, diethylene glycol monoethyl ether, diethylene glycol monoethyl ether acetate, benzyl alcohol, toluene, 3-methoxy-3-methylbutanol, triethylene glycol monomethyl ether, triethylene glycol dimethyl ether, dipropylene glycol monomethyl ether, dipropylene glycol monobutyl ether, tripropylene glycol monomethyl ether, tripropylene glycol monobutyl ether, propylene carbonate, dimethyl sulfoxide (DMSO), N-methyl-2-pyrrolidone, and the like.

The composite powder paste may be applied onto the top of the frame part of the package base, but is preferably applied in a frame shape along the peripheral end edge region of the glass cover. With this, the sealing material layer does not need to be seized to the package base, and thermal degradation of the internal device, such as a deep ultraviolet LED device, can be suppressed.

As a method of producing the hermetic package of the present invention, it is preferred to radiate laser light to the sealing material layer from a glass cover side to soften and deform the sealing material layer, to thereby hermetically seal the package base and the glass cover with each other to obtain a hermetic package. In this case, the glass cover may be arranged below the package base, but from the viewpoint of the efficiency of the laser sealing, the glass cover is preferably arranged above the package base.

Various lasers may be used as the laser. In particular, a semiconductor laser, a YAG laser, a $CO_2$ laser, an excimer laser, and an infrared laser are preferred because those lasers are easy to handle.

An atmosphere for performing the laser sealing is not particularly limited. An air atmosphere or an inert atmosphere, such as a nitrogen atmosphere, may be adopted.

At the time of laser sealing, when the glass cover is preheated at a temperature equal to or higher than 100° C.

and equal to or lower than the temperature limit of the internal device, the breakage of the glass cover due to thermal shock at the time of laser sealing is easily suppressed. In addition, when an annealing laser is radiated from the glass cover side immediately after the laser sealing, the breakage of the glass cover due to thermal shock or a residual stress is more easily suppressed.

The laser sealing is preferably performed under a state in which the glass cover is pressed. With this, the end portion of the sealing material layer easily protrudes in an arc shape at the time of laser sealing.

EXAMPLES

Now, the present invention is described in detail by way of Examples. The following Examples are merely illustrative. The present invention is by no means limited to the following Examples.

First, bismuth-based glass powder and refractory filler powder were mixed at a ratio of 90.0 mass %:10.0 mass % to produce composite powder. In this case, the bismuth-based glass powder had an average particle diameter $D_{50}$ of 1.0 μm and a 99% particle diameter $D_{99}$ of 2.5 μm, and the refractory filler powder had an average particle diameter $D_{50}$ of 1.0 μm and a 99% particle diameter $D_{99}$ of 2.5 μm. The bismuth-based glass comprises as a glass composition, in terms of mol %, 39% of $Bi_2O_3$, 23.7% of $B_2O_3$, 14.1% of ZnO, 2.7% of $Al_2O_3$, 20% of CuO, and 0.6% of $Fe_2O_3$. In addition, the refractory filler powder is β-eucryptite.

The obtained composite powder was measured for a thermal expansion coefficient. As a result, it was found that the thermal expansion coefficient was $71 \times 10^{-7}/°$ C. The thermal expansion coefficient is a value measured with a push-rod type TMA apparatus in a measurement temperature range of from 30° C. to 300° C.

Next, through use of the composite powder, a sealing material layer in a frame shape was formed at a position distant from an end edge of a glass cover made of borosilicate glass (measuring 4.0 mm in length×4.0 mm in width× 0.15 mm in thickness) by about 100 μm. Specifically, first, the above-mentioned composite powder, a vehicle, and a solvent were kneaded so as to achieve a viscosity of about 100 Pa·s (25° C., shear rate: 4), and then further kneaded with a triple roll mill until powders were homogeneously dispersed, and formed into a paste. Thus, a composite powder paste was obtained. A vehicle obtained by dissolving an ethyl cellulose resin in a glycol ether-based solvent was used as the vehicle. Next, the above-mentioned composite powder paste was printed in a frame shape with a screen printing machine along the peripheral end edge of the glass cover. Further, the composite powder paste was dried at 120° C. for 10 minutes under an air atmosphere, and then fired at 500° C. for 10 minutes under an air atmosphere. Thus, a sealing material layer was formed on the glass cover.

In addition, a package base formed of glass ceramic (measuring 4.0 mm in length×4.0 mm in width×0.8 mm in thickness of a base part) was prepared. A frame part is formed in a frame shape on the peripheral end edge of the package base. Moreover, the package base had a surface roughness Ra of from 0.1 μm to 1.0 μm. The glass ceramic is formed by sintering a laminate of green sheets each containing the glass powder and the refractory filler powder.

Finally, the package base and the glass cover were arranged so as to be laminated on each other so that a top of the frame part of the package base and the sealing material layer were brought into contact with each other. After that, while the glass cover was pressed with a pressing jig, a semiconductor laser having a wavelength of 808 nm, an output of 4 W, and an irradiation diameter of 0.5 mm was radiated at an irradiation speed of 15 mm/sec to the sealing material layer from a glass cover side to soften and deform the sealing material layer, to thereby hermetically integrate the package base and the glass cover with each other. Thus, a hermetic package was obtained. The average thickness of the sealing material layer was 5.0 μm, and the maximum width of the sealing material layer was 200 μm.

Figure 3:
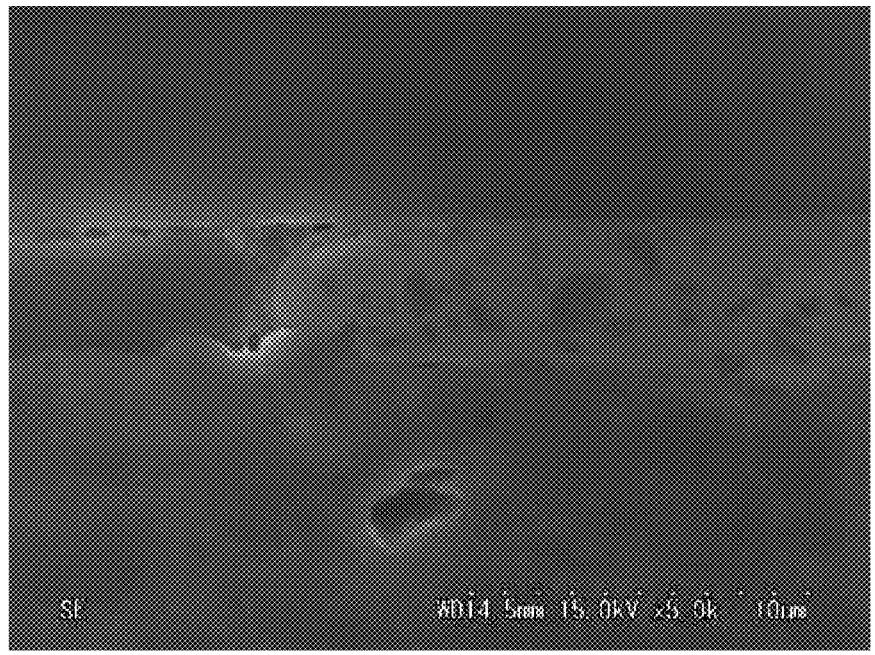
FIG. 3 is a sectional micrograph for showing the shape of an inner peripheral end portion of a sealing material layer according to Example.
Figure 4:
FIG. 4 is a sectional micrograph for showing the shape of an outer peripheral end portion of the sealing material layer according to Example.

In the resultant hermetic package, a sectional surface of an end portion of the sealing material layer was exposed by ion milling. A sectional micrograph for showing the shape of an inner peripheral end portion of the sealing material layer is shown in FIG. 3, and a sectional micrograph for showing the shape of an outer peripheral end portion of the sealing material layer is shown in FIG. 4. In each of FIG. 3 and FIG. 4, the glass cover is arranged at an upper side, and the top of the frame part of the package base is arranged at a lower side. As apparent from FIG. 3 and FIG. 4, in the resultant hermetic package, the inner peripheral end portion of the sealing material layer protruded in an arc shape in sectional view, and the outer peripheral end portion of the sealing material layer also protruded in an arc shape. Therefore, it is considered that, in the resultant hermetic package, bulk fracture due to a shear stress is less liable to occur in the sealing material layer.

The resultant hermetic package was evaluated for cracks and hermetic reliability after the laser sealing. First, the sealed sites were observed with an optical microscope. As a result, the generation of cracks was not observed. Next, the resultant hermetic package was subjected to a pressure cooker test (highly accelerated temperature and humidity stress test: HAST test), and then, the neighborhood of the sealing material layer was observed. As a result, transformation, cracks, peeling, and the like were not observed at all. The conditions of the HAST test are 121° C., a humidity of 100%, 2 atm, and 24 hours.

INDUSTRIAL APPLICABILITY

The hermetic package of the present invention is suitable as a hermetic package having mounted therein an internal device, such as a sensor chip or a deep ultraviolet LED device. Other than the above, the hermetic package of the present invention is also suitably applicable to a hermetic package having housed therein, for example, a piezoelectric vibration device, or a wavelength conversion device in which quantum dots are dispersed in a resin.

REFERENCE SIGNS LIST 1 hermetic package
10 package base
11 glass cover
12 base part
13 frame part
14 internal device (e.g., deep ultraviolet LED device)
15 sealing material layer
16 inner peripheral end portion of sealing material layer
17 outer peripheral end portion of sealing material layer
18 laser irradiation apparatus
L laser light

The invention claimed is:

1. A hermetic package comprising a package base and a glass cover hermetically sealed with each other via a sealing material layer, wherein the package base comprises a base part and a frame part formed on the base part, wherein the package base has an internal device housed within the frame part, wherein the sealing material layer is arranged between a top of the frame part of the package base and the glass cover, wherein an end portion of the sealing material layer protrudes laterally in an arc shape in sectional view, wherein the sealing material layer comprises a sintered body of composite powder containing at least bismuth-based glass powder and refractory filler powder, and wherein the bismuth-based glass powder comprises as a glass composition, in terms of mol %, 28% to 60% of $Bi_2O_3$, 0% of BaO, 15% to 37% of $B_2O_3$, 1% to 30% of ZnO, 1% to 40% of CuO, and 0.1% to 10% of $Fe_2O_3$.

2. The hermetic package according to claim 1, wherein a value obtained by dividing an average thickness of the sealing material layer by a maximum width of the sealing material layer is 0.003 or more.

3. The hermetic package according to claim 1, wherein the sealing material layer is formed at a position distant from an inner peripheral end edge of the top of the frame part and distant from an outer peripheral end edge of the top of the frame part.

4. The hermetic package according to claim 1, wherein an average thickness of the sealing material layer is less than 8.0 μm and a maximum width of the sealing material layer is from 1 μm to 1,000 μm.

5. The hermetic package according to claim 1, wherein the sealing material layer is substantially free of a laser absorber.

6. The hermetic package according to claim 1, wherein the package base comprises any one of glass, glass ceramic, aluminum nitride, and aluminum oxide, or a composite material thereof.

* * * * *